(12) United States Patent
Peng et al.

(10) Patent No.: US 8,953,326 B2
(45) Date of Patent: Feb. 10, 2015

(54) RACK-MOUNT SERVER ASSEMBLY

(71) Applicants: Hong Fu Jin Precision Industry (ShenZhen) Co., Ltd., Shenzhen (CN); Hon Hai Precision Industry Co., Ltd., New Taipei (TW)

(72) Inventors: Wen-Tang Peng, New Taipei (TW); Xiao-Zheng Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 229 days.

(21) Appl. No.: 13/721,051

(22) Filed: Dec. 20, 2012

(65) Prior Publication Data

US 2014/0160666 A1    Jun. 12, 2014

(30) Foreign Application Priority Data

Dec. 7, 2012    (CN) .......................... 2012 1 0521970

(51) Int. Cl.
*H05K 7/20* (2006.01)
*H05K 7/14* (2006.01)
*G06F 1/20* (2006.01)

(52) U.S. Cl.
CPC ................ *H05K 7/1489* (2013.01); *G06F 1/20* (2013.01)
USPC ........................................................ 361/727

(58) Field of Classification Search
USPC ........................................................ 361/727
See application file for complete search history.

(56) References Cited

U.S. PATENT DOCUMENTS

| | | | |
|---|---|---|---|
| 6,400,578 B1 * | 6/2002 | Chen ............................. | 361/829 |
| 6,574,100 B1 * | 6/2003 | Anderson .................. | 361/679.5 |
| 7,403,390 B2 * | 7/2008 | Franz et al. ................... | 361/695 |
| 8,749,982 B2 * | 6/2014 | Wu et al. ....................... | 361/724 |
| 2003/0112596 A1 * | 6/2003 | Shih ............................. | 361/685 |
| 2009/0161309 A1 * | 6/2009 | Yang ........................ | 361/679.39 |
| 2012/0120611 A1 * | 5/2012 | Ni et al. ........................ | 361/727 |

* cited by examiner

*Primary Examiner* — Anthony Q Edwards
(74) *Attorney, Agent, or Firm* — Novak Druce Connolly Bove + Quigg LLP

(57) ABSTRACT

A rack-mount server assembly includes a rack and a server module received in an upper portion of the rack. The server module includes two opposite sliding rails installed in the rack, and a hard disk drive unit detachably attached between the sliding rails. The hard disk drive unit includes a frame defining an opening and a number of hard disk drives installed in the frame through the opening. The opening of the hard disk drive unit faces a bottom of the rack.

8 Claims, 7 Drawing Sheets

RACK-MOUNT SERVER ASSEMBLY

BACKGROUND

1. Technical Field

The present disclosure relates to a rack-mount server assembly.

2. Description of Related Art

A server module assembly includes a high rack supported on a support surface and a plurality of server modules received in the rack. Each server module includes an enclosure for mounting a plurality of modules, such as circuit boards, hard disk drives, and fans. Sometimes, the server module away from the support surface needs to be repaired. Thus, a ladder needs be used to allow a person to reach the server module for repair, which is inconvenient.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
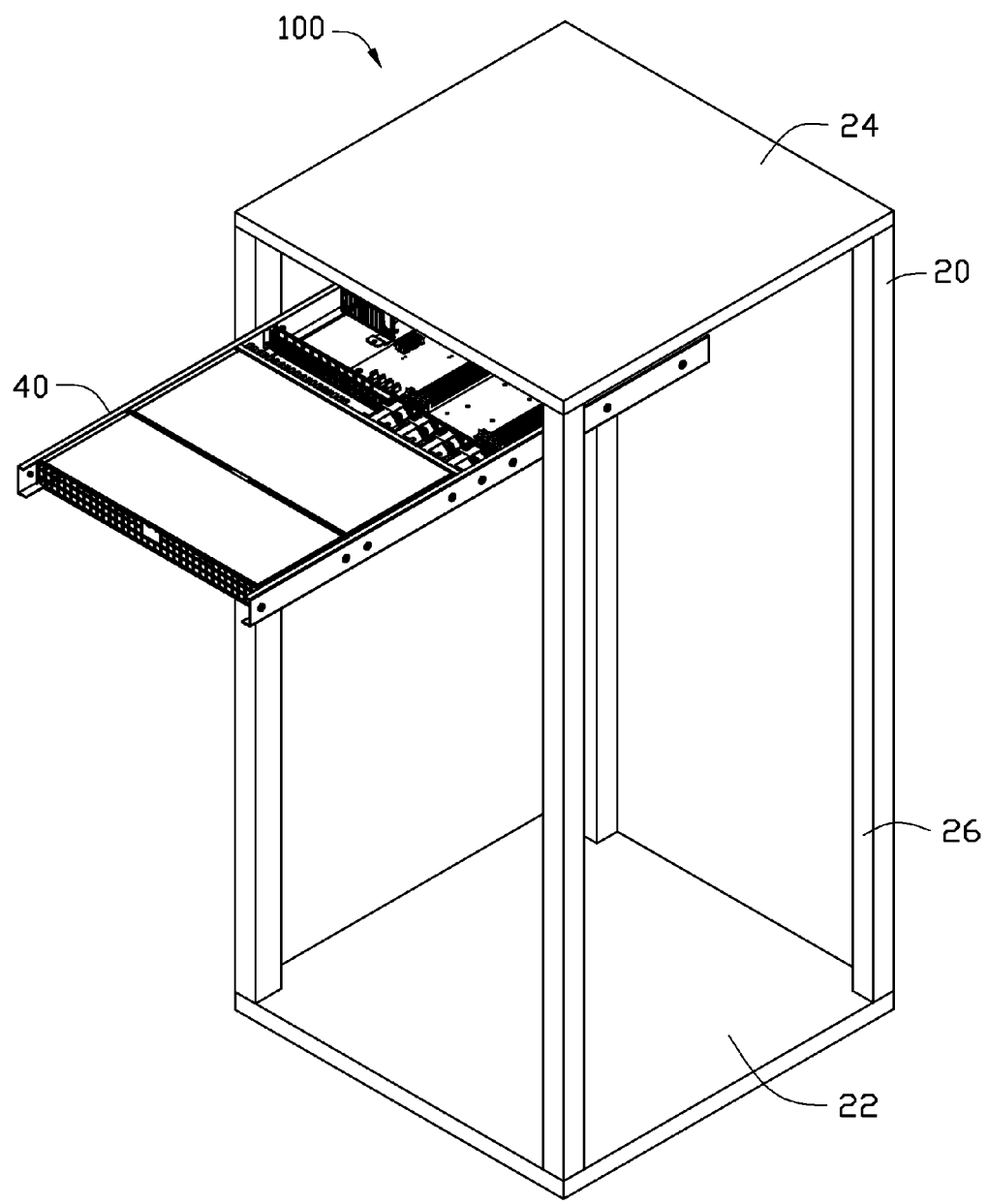
FIG. 1 is an isometric view of an exemplary embodiment of a rack-mount server assembly, wherein the rack-mount server assembly includes a server module.
Figure 2:
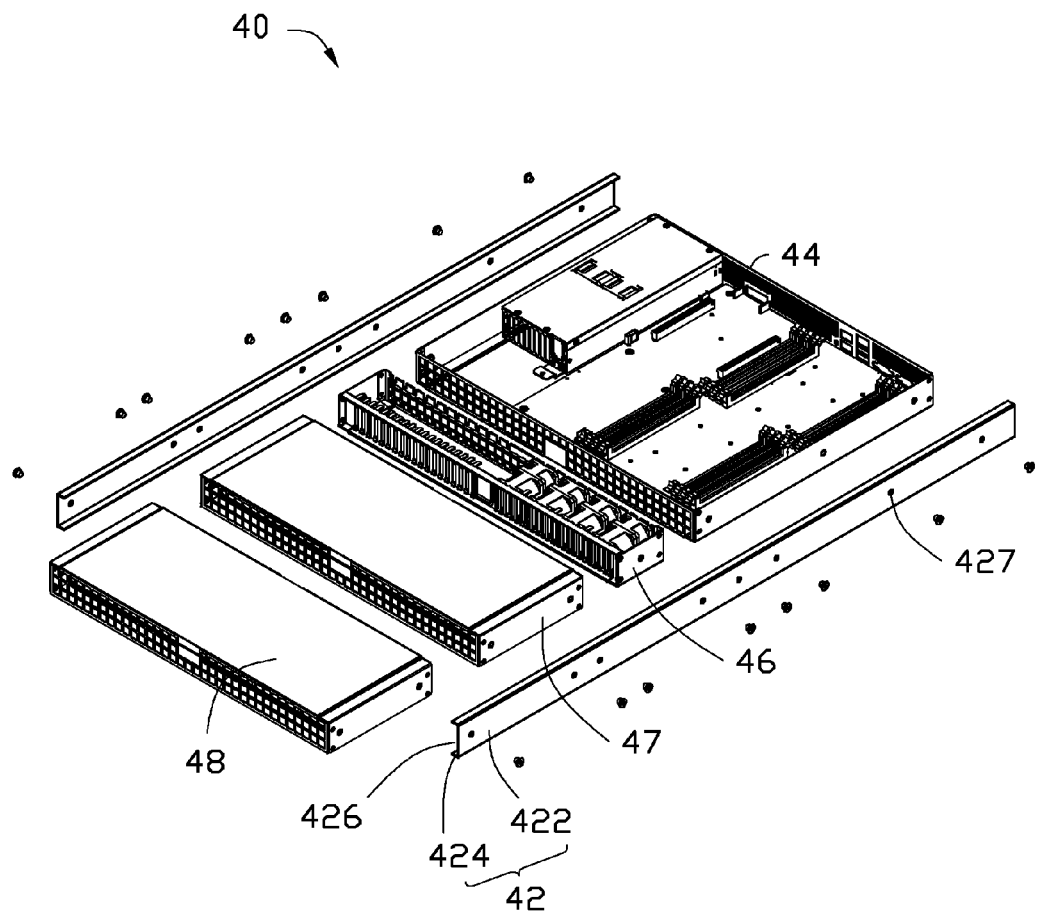
FIG. 2 is an exploded, isometric view of the server module of FIG. 1, wherein the server module includes a motherboard unit, a fan unit, a first hard disk drive unit, and a second hard disk drive unit.

FIG. 1 and FIG. 2 show an exemplary embodiment of a rack-mount server assembly 100. The rack-mount server assembly 100 includes a rack 20, and a server modules 40 received in an upper portion of the rack 20. The rack 20 includes a rectangular base 22, a top wall 24 opposite to the base 22, and four support poles 26 respectively connected between four corners of the base 22 and the top wall 24.

The server module 40 includes a pair of sliding rails 42 and a plurality of functional modules. The functional modules include a motherboard unit 44, a fan unit 46, a first hard disk drive unit 47, and a second hard disk drive unit 48. The motherboard unit 44, fan unit 46, first hard disk drive unit 47, and second hard disk drive unit 48 are detachably inserted between the sliding rails 42. In the embodiment, the first hard disk drive unit 47 is used to install 3.5-inch hard disk drives, and the second hard disk drive unit 48 is used to install 2.5-inch hard disk drives.

Each sliding rail 42 includes a rectangular installation plate 422 and two flanges 424 perpendicularly extending from a top side and a bottom side of the installation plate 422 respectively. The installation plate 422 and the flanges 424 cooperatively bound a slide slot 426. The installation plate 422 defines a plurality of through holes 427. The through holes 427 are arrayed in a row along a lengthwise direction of the installation plate 422.

Figure 3:
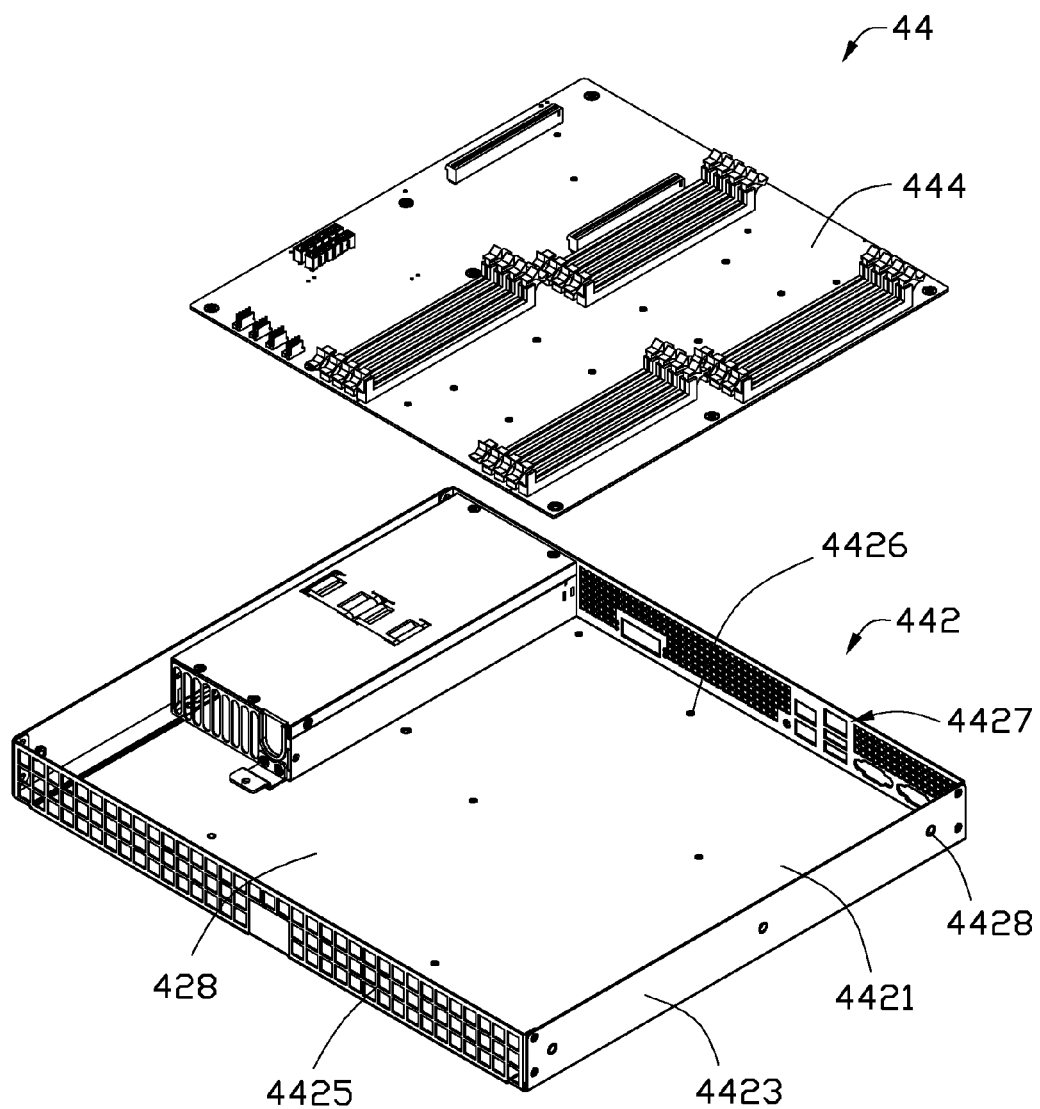
FIG. 3 is an exploded, enlarged view of the motherboard unit of FIG. 2.

FIG. 3 shows the motherboard unit 44 of the embodiment. The motherboard unit 44 includes a rectangular frame 442 and a motherboard 444. The frame 442 includes a bottom plate 4421, two opposite side plates 4425 perpendicularly extending up from front and rear sides of the bottom plate 4421, and two opposite end plates 4423 perpendicularly extend up from left and right sides of the bottom plate 4421. The bottom plate 4421, the side plates 4425, and two end plates 4423 cooperatively bound a receiving space 428. The receiving space 428 defines an opening 4427 opposite to the bottom plate 4421. The bottom plate 4421 defines a plurality of fastening holes 4426. Each end plate 4423 defines a plurality of screw holes 4428. Each side plate 4425 defines a plurality of vents. The motherboard 444 is mounted on the bottom plate 4421 with many fasteners extending through the motherboard 444, and is inserted into the corresponding fastening holes 4426. In another embodiment, a different type of motherboards 444 is mounted on the bottom plate 4421 by changing different arranged fastening holes 4426.

Figure 4:
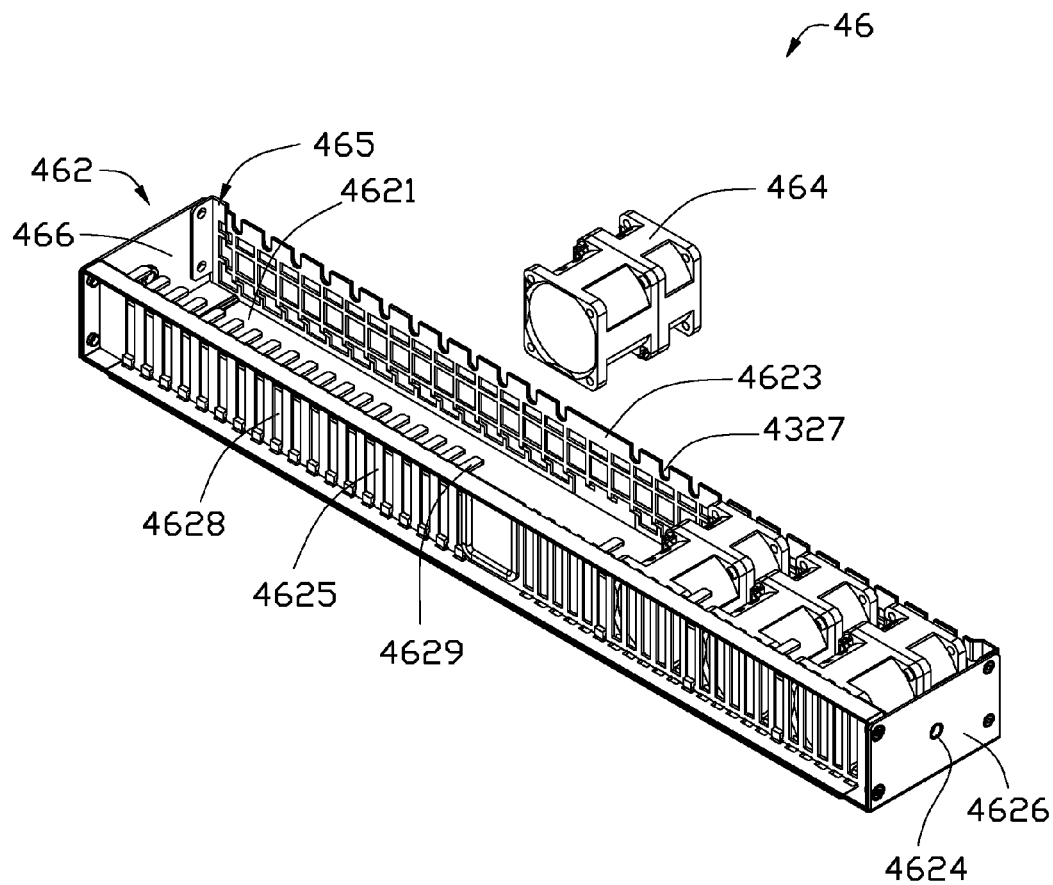
FIG. 4 is an exploded, enlarged view of the fan unit of FIG. 2.

FIG. 4 shows the fan unit 46 of the embodiment. The fan unit 46 includes a rectangular frame 462 and a plurality of fans 464. The frame 462 includes a bottom plate 4621, a front side plate 4623 perpendicularly extending up from a front side of the bottom plate 4621, a rear side plate 4625 perpendicularly extending up from a rear side of the bottom plate 4621 opposite to the front side plate 4623, and two end plates 4626 respectively connected between corresponding ends of the front side plate 4623 and rear side plate 4625. The bottom plate 4621, the front side plate 4623, the rear side plate 4625, and the end plate 4626 cooperatively bound a receiving slot 466. The receiving slot 466 defines an opening 465 opposite to the bottom plate 4621. The front side plate 4623 defines a plurality of cutouts 4327 in a top side of the side plate 4623 and a plurality of vents. The cutouts 4327 are arrayed in a row along a lengthwise direction of the front side plate 4623. The rear side plate 4625 defines a plurality of through slots 4628 extending along a direction perpendicular to the bottom plate 4621. The through slots 4628 are arrayed in a row along a lengthwise direction of the rear side plate 4625. A baffling piece 4629 is detachably inserted into each through slot 4628. Each end plate 4626 defines a plurality of screw holes 4624. Each fan 464 is sandwiched between the front side plate 4623 and the rear side plate 4625, and is fixed by fasteners latching into the corresponding latching holes 4327 and the fan 464.

Figure 5:
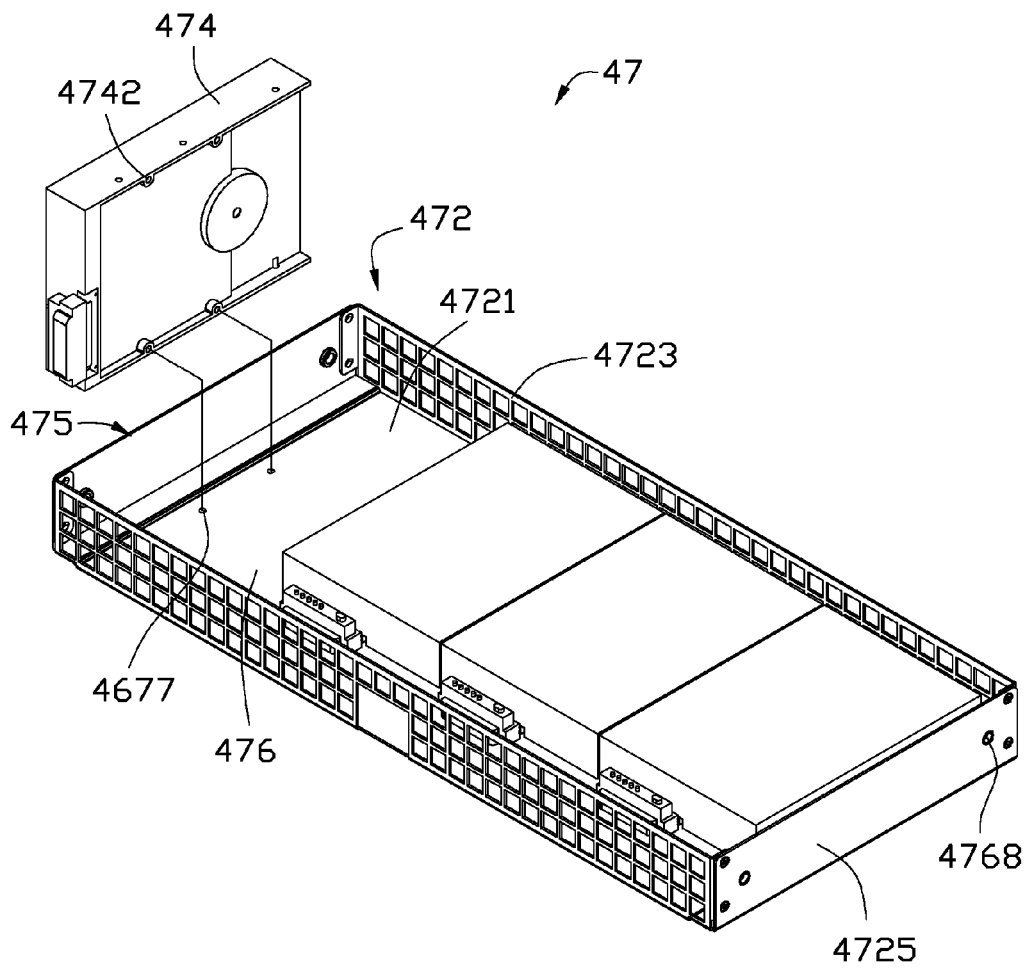
FIG. 5 is an inverted, exploded, enlarged view of the first hard disk drive unit of FIG. 2.

FIG. 5 shows the first hard disk drive unit 47. The first hard disk drive unit 47 includes a rectangular frame 472 and a plurality of hard disk drives 474. The frame 472 includes a bottom plate 4721, two opposite side plates 4723 perpendicularly extending up from two sides of the bottom plate 4721. In addition, two end plates 4725 respectively extending up from two ends of the bottom plate 4721 and connected between corresponding ends of the side plates 4723. The bottom plate 4721, the side plates 4723, and the end plates 4725 cooperatively bound a receiving space 476. The receiving space 476 defines an opening 475 opposite to the bottom plate 4721. Each end plate 4725 defines a plurality of screw holes 4768.

Each side plate 4723 defines a plurality of vents. The bottom plate 4721 defines a plurality of through holes 4677. A bottom surface of each hard disk drive 474 defines a plurality of screw holes 4742. Each hard disk drive 474 is inserted into the receiving space 476 through the opening 475 to be supported on the bottom plate 4721. A plurality of screws respectively extends through the corresponding through holes 4677, to be screwed into the screw holes 4742 of the hard disk drive 474.

Figure 6:
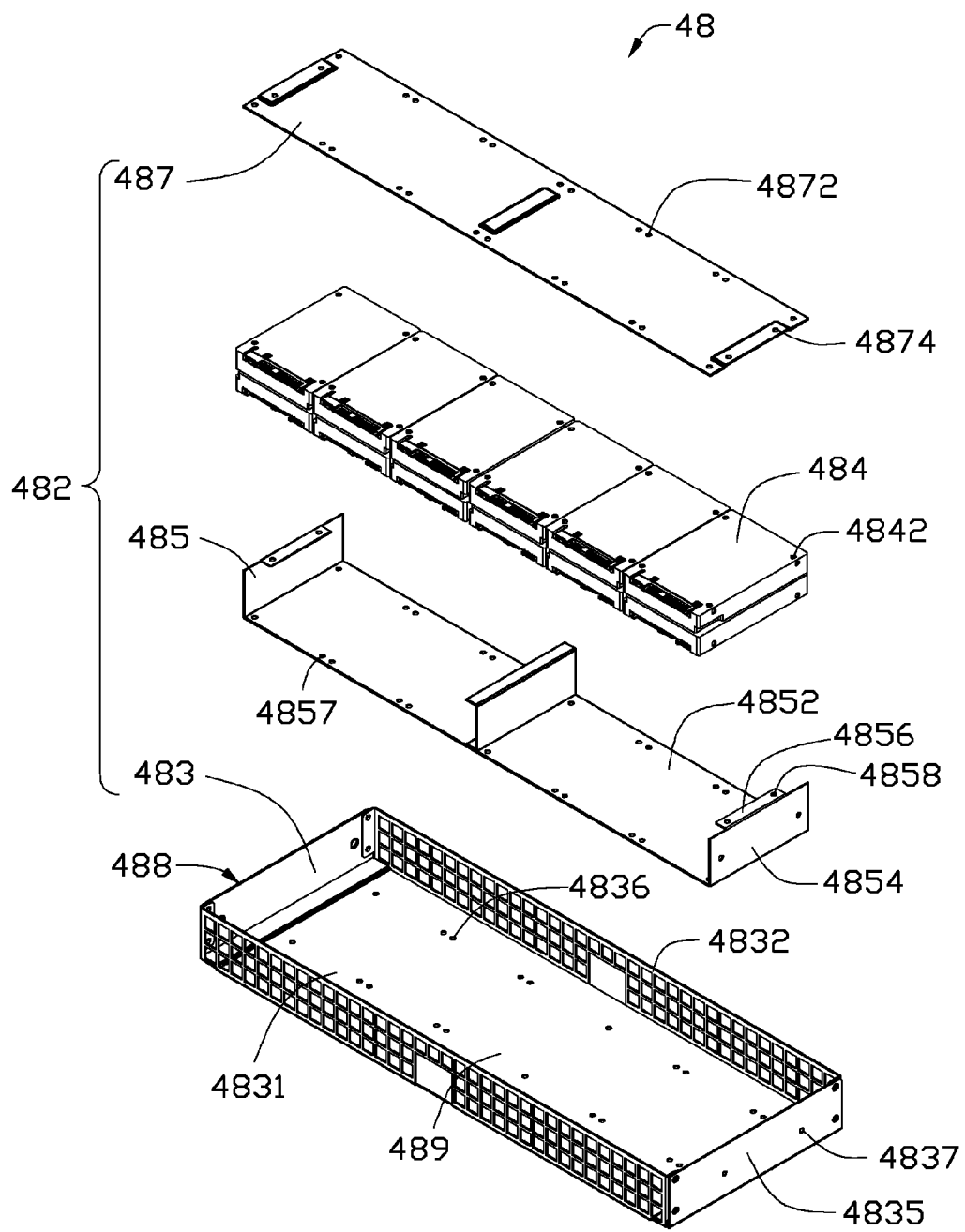
FIG. 6 is an inverted, exploded, enlarged view of the second hard disk drive unit of FIG. 2.

FIG. 6 shows the second hard disk drive unit 48. The second hard disk drive unit 48 includes an installing assembly 482 and a plurality of hard disk drives 484. The installing assembly 482 includes a rectangular frame 483, a support bracket 485, and a rectangular connecting plate 487.

The frame 483 includes a bottom plate 4831, two opposite side plates 4832 perpendicularly extending up from two sides of the bottom plate 4831, and two end plates 4835 respectively extending up from two ends of the bottom plate 4831 and connected between corresponding ends of the side plates 4832. The bottom plate 4831, the side plates 4832, and the end plates 4835 cooperatively bound a receiving space 489. The receiving space 489 defines an opening 488 opposite to the bottom plate 4831. Each side plate 4832 defines a plurality of vents. The bottom plate 4831 defines a plurality of through holes 4836. Each end plate 4835 defines a plurality of screw holes 4837.

The support bracket 485 includes a rectangular support plate 4852, two opposite end plates 4854 perpendicularly extending up from two ends of the support plate 4852, and two tabs 4856 perpendicularly extending toward each other from the tops of the end plates 4854. The support plate 4852 defines a plurality of through holes 4857. Each tab 4856 defines a plurality of screw holes 4858. The connecting plate 487 defines a plurality of through holes 4872 in two opposite sides of the connecting plate 487, and a plurality of position holes 4874 in two opposite ends of the connecting plate 4872. A bottom surface of each hard disk drive 484 defines a plurality of screw holes 4842.

In assembly of the second hard disk drive 48, the support bracket 485 is received in the receiving space 489 from the opening 488. The support plate 4852 is supported on the bottom plate 4831, and some of the hard disk drives 484 are supported on the support plate 4852 and arrayed in a row along a lengthwise direction of the support plate 4852. A plurality of screws respectively extends through the through holes 4836 of the frame 483 and the through holes 4857 of the support plate 4852, to be screwed into the screw holes 4842 of the lower hard disk drives 484. A plurality of screws respectively extends through the through holes 4872 of the connecting plate 487, to be screwed into the screw holes 4842 of the other hard disk drives 484. A combination of the connecting plate 487 and the upper hard disk drives 484 is supported on the lower hard disk drives 484. A plurality of screws extends through the position holes 4874 of the connecting plate 487, to be screwed into the screw holes 4858 of the tabs 4856.

Figure 7:
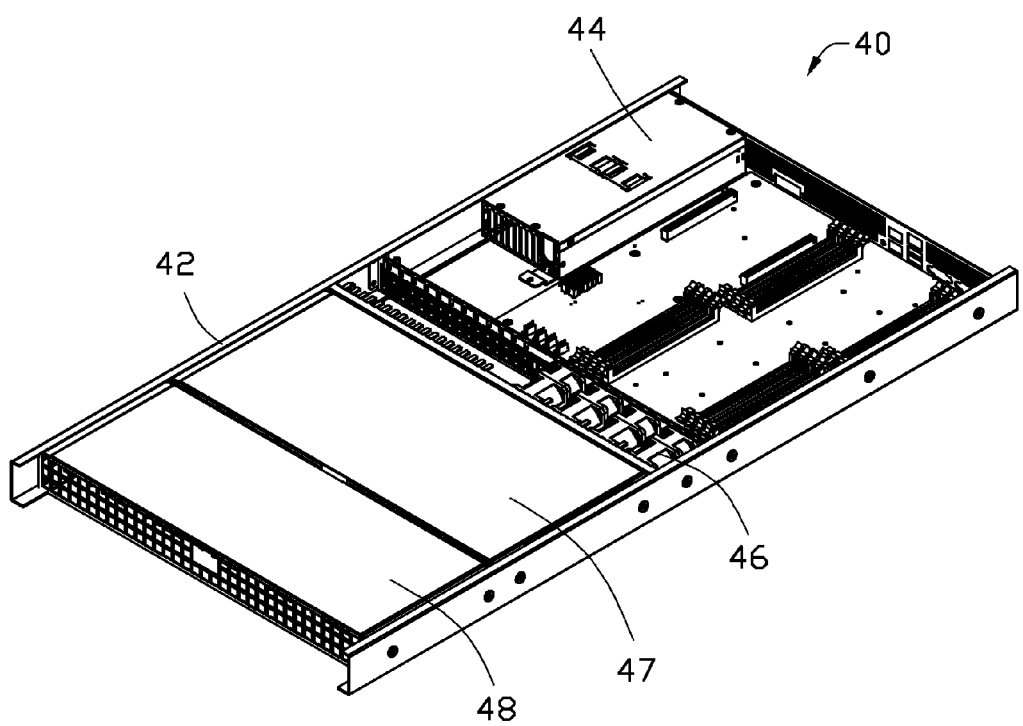
FIG. 7 is an assembled, isometric view of FIG. 2.

FIG. 7 shows that in assembly of the server module 40, the end plates 4423 of the motherboard unit 44 are slidably received in the slide slots 426 of the sliding rails 42, respectively. A plurality of screws respectively extend through the through holes 427 of the sliding rails 42, to be screwed into the screw holes 4428. The end plates 4626 are slidably inserted into the slide slots 426, respectively, until the front side plate 4623 is engaged with the side plate 4425. A plurality of screws respectively extends through the corresponding through holes 427, to be screwed into the screw holes 4624. The first hard disk drive unit 47 is inverted to make the opening 475 of the first hard disk drive unit 47 face downward. The end plates 4723 of the first hard disk drive unit 47 are slidably inserted into the slide slots 426, until the side plate 4723 is engaged with the rear side plate 4625. A plurality of screws respectively extends through the corresponding through holes 427, to be screwed into the screw holes 4768. The second hard disk drive unit 48 is inverted to make the opening 488 of the second hard disk drive unit 48 face downward. The end plates 4835 of the second hard disk drive unit 48 are slidably inserted into the slide slots 426, until the side plate 4832 is engaged with the corresponding side plate 4723. A plurality of screws respectively extends through the corresponding through holes 427, to be screwed into the screw holes 4837.

The server module 40 is inserted in the upper portion of the rack 20, to allow the opening 475 of the first hard disk drive unit 47 and the opening 488 of the second hard disk drive unit 48 to face the base 22. It is convenient to repair the hard disk drives 474 and 484 through the openings 475 and 488, and a ladder is not needed. The opening 4427 of the motherboard unit 44 faces the top wall 24 of the rack 20.

In another embodiment, the fan unit 46 can be inverted and sandwiched between the sliding rails 42, to allow the opening 465 of the fan unit to face the base 22.

In another embodiment, two or more than two fan units 46, first hard disk drive units 47, and second hard disk drive units 48 can be installed into the slide slots 426 of the sliding rails 42.

Even though numerous characteristics and advantages of the embodiments have been set forth in the foregoing description, together with details of the structure and function of the embodiments, the present disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. A rack-mount server assembly, comprising:
   a rack; and
   a server module received in an upper portion of the rack, the server module comprising two opposite sliding rails respectively installed in the rack and a hard disk drive unit detachably attached between the sliding rails;
   wherein the hard disk drive unit comprises a first frame defining an opening and a plurality of hard disk drives installed in the frame through the opening, the opening of the hard disk drive unit faces a bottom of the rack.

2. The rack-mount server assembly of claim 1, wherein the first frame comprises a main plate, two opposite side plates extending up from two sides of the main plate, and two end plates respectively extending up from two ends of the main plate, the opening is bounded by the side plates and the end plates opposite to the main plate.

3. The rack-mount server assembly of claim 2, wherein each sliding rail comprises an installation plate, and two opposite flanges extending from two sides of the installation plate, the installation plate and the flanges cooperatively bound a slide slot, the end plates of the hard disk drive unit are slidably inserted into the slide slots.

4. The rack-mount server assembly of claim 3, wherein the installation plate of each sliding rail defines a plurality of through holes, each end plate of the first frame defines a plurality of screw holes, a plurality of screws respectively extends through the through holes of the sliding rails, to be screwed into the screw holes of the frame.

5. The rack-mount server assembly of claim 3, wherein the server module further comprises a motherboard unit detachably attached between the sliding rails, the motherboard unit comprises a second frame and a motherboard, the second frame comprises a bottom plate and two opposite end plates extending up from two ends of the bottom plate, the bottom plate of the motherboard unit defines a plurality of fastening holes for mounting the motherboard.

6. The rack-mount server assembly of claim 5, wherein the installation plate of each sliding rail defines a plurality of through holes, each end plate of the motherboard unit defines a plurality of screw holes, the end plates the motherboard unit are slidably received in the slide slots, a plurality of screws extends through the through holes of the sliding rails, to be screwed into the screw holes of the motherboard unit.

7. The rack-mount server assembly of claim 3, wherein the server module further comprises a fan unit detachably attached between the sliding rails, the fan unit comprises a bottom plate, a front side plate extending down from a front side of the bottom plate, a rear side plate extending down from a rear side of the bottom plate opposite to the front side plate, and two end plates respectively connected between corresponding ends of the front side plate and rear side plate, the bottom plate, the front side plate, the rear side plate and the end plates cooperatively bound a receiving slot, the receiving slot defines an opening opposite to the bottom plate of the fan unit, the fans are received in the receiving slot through the opening of the fan unit.

8. The rack-mount server assembly of claim 7, wherein the installation plate of each sliding rail defines a plurality of through holes, each end plate of the fan unit defines a plurality of screw holes, the end plates the fan unit are slidably received in the slide slots, a plurality of screws extends through the through holes of the sliding rails, to be screwed into the screw holes of the fan unit.

* * * * *